(12) United States Patent
Qian et al.

(10) Patent No.: US 11,387,431 B2
(45) Date of Patent: Jul. 12, 2022

(54) METHOD OF MANUFACTURING ENCAPSULATION LAYER AND DISPLAY SUBSTRATE

(71) Applicant: BOE TECHNOLOGY GROUP CO., LTD., Beijing (CN)

(72) Inventors: Lingzhi Qian, Beijing (CN); Ziyu Zhang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/714,089

(22) Filed: Dec. 13, 2019

(65) Prior Publication Data

US 2020/0235336 A1     Jul. 23, 2020

(30) Foreign Application Priority Data

Jan. 21, 2019   (CN) .......................... 201910054866.3

(51) Int. Cl.
| | |
|---|---|
| *H01L 51/52* | (2006.01) |
| *H01L 51/56* | (2006.01) |
| *H01L 51/00* | (2006.01) |
| *H01L 27/32* | (2006.01) |

(52) U.S. Cl.
CPC ...... *H01L 51/5253* (2013.01); *H01L 27/3244* (2013.01); *H01L 51/0016* (2013.01); *H01L 51/56* (2013.01)

(58) Field of Classification Search
None
See application file for complete search history.

(56) References Cited

U.S. PATENT DOCUMENTS

| | | | |
|---|---|---|---|
| 2002/0048829 A1* | 4/2002 | Yamazaki | H01L 29/42384 438/16 |
| 2016/0247863 A1* | 8/2016 | Choung | H01L 27/3246 |
| 2018/0053810 A1* | 2/2018 | Jin | G06F 3/04164 |
| 2018/0212002 A1* | 7/2018 | Hou | H01L 51/5088 |
| 2018/0261792 A1* | 9/2018 | Kwon | H01L 27/3209 |
| 2020/0044190 A1* | 2/2020 | Luo | H01L 51/56 |

FOREIGN PATENT DOCUMENTS

| | | |
|---|---|---|
| CN | 101577316 A | 11/2009 |
| CN | 103515413 A | 1/2014 |
| CN | 104766931 A | 7/2015 |
| CN | 108461647 A | 8/2018 |
| CN | 109065763 A | 12/2018 |

OTHER PUBLICATIONS

Office Action dated Aug. 3, 2020 issued in corresponding Chinese Application No. 201910054866.3.

* cited by examiner

*Primary Examiner* — Vincent Wall
(74) *Attorney, Agent, or Firm* — Nath, Goldberg & Meyer; Joshua B. Goldberg

(57) ABSTRACT

The disclosure provides a method of manufacturing an encapsulation layer and a display substrate. The method of manufacturing the encapsulation layer includes: forming a strippable layer on a first region of a substrate; forming an organic material layer on a second region of the substrate, the organic material layer comprising a portion covering the second region and an overflow portion exceeding the second region and at least partially covering the first region, wherein the first region and the second region are adjoined to each other; and stripping the strippable layer from the substrate to remove the overflow portion of the organic material layer and form an organic encapsulation layer.

16 Claims, 5 Drawing Sheets

METHOD OF MANUFACTURING ENCAPSULATION LAYER AND DISPLAY SUBSTRATE

The present application claims the priority from Chinese Patent Application No. 201910054866.3 filed with the Chinese Patent Office on Jan. 21, 2019, which is hereby incorporated by reference in its entirety.

FIELD OF INVENTION

The disclosure relates to the field of display technology, and particularly to a method of manufacturing an encapsulation layer and a display substrate.

BACKGROUND

At present, the Thin Film Encapsulation (TFE) technology has been widely used in the encapsulation structure of the light emitting layer of the flexible Organic Light Emitting Diode (OLED). When the TFE technology is used to encapsulate the light emitting layer of the OLED, the liquid organic material may be coated on the light emitting layer of the formed OLED, and then the liquid organic material is cured to form the organic material layer.

BRIEF SUMMARY

According to an aspect of the disclosure, a method of manufacturing an encapsulation layer is provided, which includes: forming a strippable layer on a first region of a substrate; and forming an organic material layer on a second region of the substrate, the organic material layer including a portion covering the second region and an overflow portion exceeding the second region and at least partially covering the first region, wherein the first region and the second region are adjoined to each other; and stripping the strippable layer from the substrate to remove the overflow portion of the organic material layer and form an organic encapsulation layer.

In an embodiment, forming the strippable layer on the first region of the substrate includes: coating photoresist on the first region of the substrate to form the strippable layer.

In an embodiment, stripping the strippable layer from the substrate includes: illuminating or heating the photoresist so as to lower the viscidity of the photoresist; and stripping the photoresist manually or mechanically.

In an embodiment, before coating the photoresist on the first region of the substrate to form the strippable layer, the method further includes: forming a first inorganic material layer on the substrate, wherein the first inorganic material layer completely covers the substrate, and a surface of the strippable layer at a side proximal to the substrate contacts with the first inorganic material layer.

In an embodiment, after coating the photoresist on the first region of the substrate to form the strippable layer, the method further includes: etching the photoresist so that surface roughness of the strippable layer is greater than surface roughness of the first inorganic material layer.

In an embodiment, forming the organic material layer includes: coating a liquid organic material on the substrate by an ink-jet printing process, wherein the liquid organic material at least covers the whole second region and a part of the first region proximal to the second region; and curing the liquid organic material to form the organic material layer.

In an embodiment, the liquid organic material includes an ink material.

In an embodiment, after forming the organic encapsulation layer, the method further includes: forming a second inorganic material layer, wherein the second inorganic material layer completely covers the organic encapsulation layer.

In an embodiment, the method further includes: forming a first protruding structure at an adjoining position of the first region and the second region of the substrate.

In an embodiment, the method further includes: forming a second protruding structure on the first region of the substrate, and the second protruding structure being at a side of the first protruding structure distal to the second region.

In an embodiment, before forming the first inorganic material layer on the substrate, the method further includes: arranging a light emitting layer of an OLED on the second region.

According to another aspect of the disclosure, a display substrate is provided, which includes: a substrate; a light emitting layer of an OLED; and an organic encapsulation layer; wherein the substrate includes a first region and a second region which are adjoined with each other, and the light emitting layer of the OLED is arranged on the second region; and the organic encapsulation layer is on a side of the light emitting layer of the OLED away from the substrate by using the method of forming the encapsulation layer in any above-mentioned embodiment.

DETAILED DESCRIPTION OF THE EMBODIMENTS

Figure 1A:
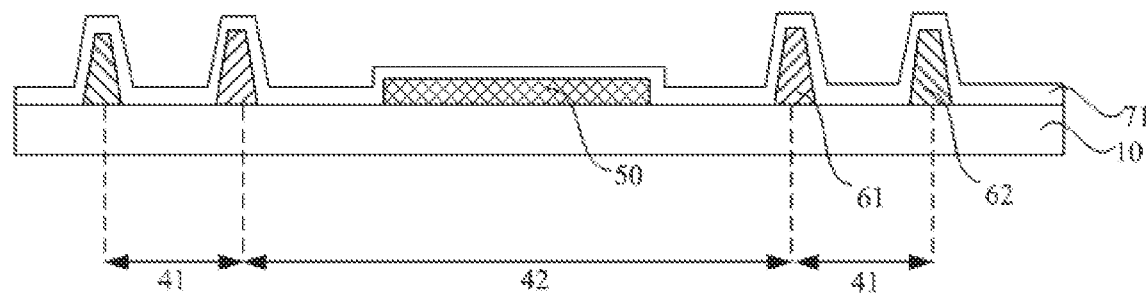
FIGS. 1a-1d are schematic diagrams showing structures at respective steps in a method of manufacturing a display substrate provided by an embodiment of the disclosure.
Figure 1B:
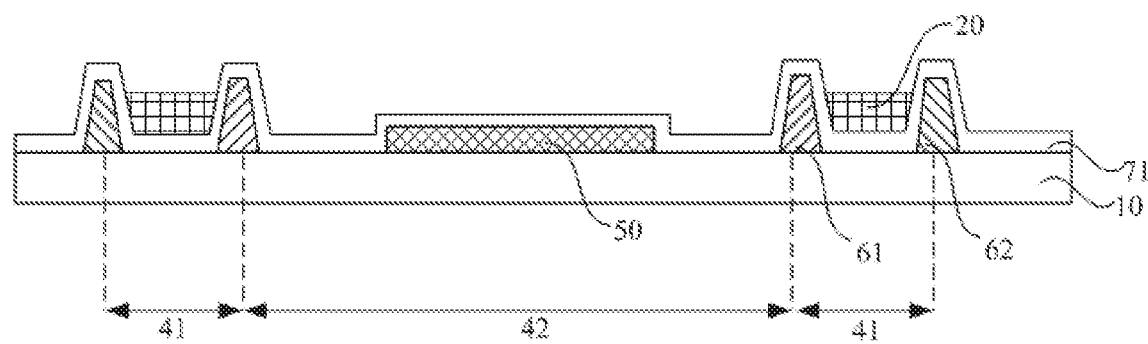
Figure 1C:
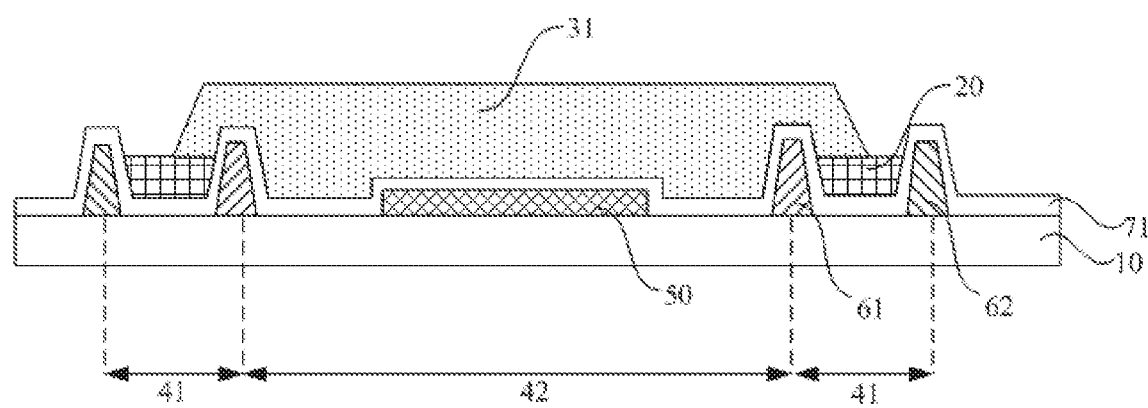

In order to enable those skilled in the art to better understand the technical solution of the disclosure, the disclosure will be further illustrated below in details with reference to the accompanying drawings and the specific embodiments.

The disclosure will be illustrated below in details with reference to the accompanying drawings. In all the accompanying drawings, the same elements are represented by the similar reference numbers. For clarity, all the parts in the accompanying drawings are not drawn to scale. Furthermore, some well-known parts may be not shown in the drawings.

Many specific details of the disclosure are described below, such as the structures, materials, dimensions of the components, processes and techniques, in order to describe the disclosure more clearly. However, as those skilled in the art can understand, the disclosure can be achieved without these specific details.

When the TFE technology is used to encapsulate the light emitting layer of the OLED, the liquid organic material may be coated on the structure (such as substrate) to be encapsulated, and then the liquid organic material is cured to form the organic material layer. The levelling property, edge linearity, film thickness uniformity and the like of the organic material layer have an important influence on the encapsulation effect of the light emitting layer of the OLED in the display substrate. But in the process of forming the organic material layer, the factors such as viscosity and surface tension of the liquid organic material may lead to defects in the edge portion of the formed solid organic material layer, e.g., slope climbing, uneven layer thickness, poor linearity and the like, and thus may have an adverse effect on the luminescence of the light emitting layer of the OLED and then affect the display effect. As shown in FIGS. 1a-1d and 2, an embodiment of the disclosure provides a method of manufacturing an encapsulation layer, and this method may include steps S201-S203.

In the step S201, a strippable layer 20 is formed on a first region 41 of a substrate.

In the step S202, an organic material layer 31 is formed on a second region 42 of the substrate, the organic material layer 31 including a portion covering the second region 42 and an overflow portion exceeding the second region 42 and at least partially covering the first region 41, wherein the first region 41 and the second region 42 are adjoined to each other.

In the step S203, the strippable layer 20 is stripped from the substrate to remove the overflow portion of the organic material layer and form an organic encapsulation layer 30.

According to an embodiment provided by the disclosure, a first protruding structure 61 may be arranged at the adjoining position of the first region 41 and the second region 42 of the substrate.

According to an embodiment provided by the disclosure, a second protruding structure 62 may be arranged on the first region 41 of the substrate, and the second protruding structure 62 is located at the side of the first protruding structure 61 distal to the second region 42.

According to an embodiment provided by the disclosure, the first protruding structure 61 is a convex structure arranged on the substrate 10 for separating the first region 41 from the second region 42, so the first protruding structure 61 can align the inner edge of the strippable layer 20 with the edge of the second region 42 as possible, so that the edge of the formed organic encapsulation layer 30 can be closer to the edge of the display region (second region 42) and more regular in the subsequent step of stripping the strippable layer 20.

The second protruding structure 62 is a convex structure arranged on the substrate 10 for defining the first region 41 together with the first protruding structure 61, so the first protruding structure 61 and the second protruding structure 62 can not only ensure the accurate position of the formed strippable layer 20 (that is, the strippable layer 20 is limited between the first protruding structure 61 and the second protruding structure 62), but also the second protruding structure 62 can avoid the liquid organic material overflowing from the outer edge of the first region 41 in the subsequent step of forming the organic material layer 31.

According to an embodiment provided by the disclosure, forming the organic material layer 31 may specifically include: coating the liquid organic material on the substrate by the ink-jet printing process, wherein the liquid organic material at least cover the whole second region 42 and a part of the first region 41 proximal to the second region 42; and then curing the liquid organic material to form the organic material layer 31. The liquid organic material may include an ink material, such as epoxy resin or acrylic ester or the like.

According to the embodiments provided by the disclosure, when the strippable layer 20 is stripped from the substrate 10, the strippable layer 20 may exert an external force on the edge of the organic material layer 31, so that an edge portion of the organic material layer 31 located on the strippable layer 20 is separated from the other portion of the organic material layer 31, that is, the edge portion of the organic material layer 31 covering the strippable layer 20 is removed, thereby forming the organic encapsulation layer 30 without the edge defect. In an implementation, the actual edge of the organic encapsulation layer 30 after the stripping may be aligned with the edge of the strippable layer 20 before the stripping, so that the linearity of the edge of the organic encapsulation layer 30 may be good.

The edge portion with defect of the organic material layer 31 can be removed by stripping the strippable layer 20, to form the organic encapsulation layer 30 without the edge defect, thereby improving the edge characteristics of the organic film layer, improving the edge encapsulation effect of the device, and thus promoting the realization of the narrow border of the device.

According to an embodiment provided by the disclosure, forming the strippable layer 20 on the first region 41 of the substrate may specifically include: coating the photoresist on the first region 41 of the substrate to form the strippable layer 20.

Accordingly, stripping the strippable layer 20 from the substrate may specifically include: illuminating the photoresist so as to lower the viscidity of the photoresist; and stripping the photoresist manually or mechanically. Alternatively, stripping the strippable layer 20 from the substrate may also include: heating the photoresist so as to lower the viscidity of the photoresist; and stripping the photoresist manually or mechanically.

Before the strippable layer 20 (photoresist) is illuminated or heated, the strippable layer 20 fits onto the substrate 10 closely. Thus, when the organic material layer 31 is formed, the strippable layer 20 will not affect the formation of the organic material layer 31; and after the strippable layer 20 is illuminated or heated, the viscidity of the strippable layer 20 is lowered so that the strippable layer 20 can be stripped from the substrate 10 easily, which will not affect the organic encapsulation layer 30 covering the display region (second region 42), thereby ensuring the performance of the organic encapsulation layer 30 of the display region.

According to an embodiment provided by the disclosure, before coating the photoresist on the first region 41 of the substrate to form the strippable layer 20, the method of manufacturing the encapsulation layer may further include: forming a first inorganic material layer 71 on the substrate, wherein the first inorganic material layer 71 integrally covers the substrate, that is, the first inorganic material layer 71 integrally covers the first region 41 and the second region 42, and the surface of the strippable layer 20 at a side proximal to the substrate contacts with the first inorganic material layer 71.

According to an embodiment provided by the disclosure, after coating the photoresist on the first region 41 of the substrate to form the strippable layer, the method of manufacturing the encapsulation layer may further include: etching the photoresist (strippable layer 20) so that the surface roughness of the strippable layer 20 is greater than the surface roughness of the first inorganic material layer 71.

Since the surface roughness of the strippable layer 20 is greater than the surface roughness of the underlying structure (e.g. the first inorganic material layer 71 or the substrate) where the strippable layer 20 is located, the speed at which a liquid material extends on the surface of the strippable layer 20 is slower than the speed at which the liquid material extends on the surface of the underlying structure where the strippable layer 20 is located, so that the extending distance of the liquid material on the surface of the strippable layer 20 per unit time is smaller; that is, the overflow portion of the organic material layer 31 formed from the liquid material is smaller, so that the smaller non-display region (first region 41) may be reserved to promote the realization of the narrow border of the display device.

According to an embodiment provided by the disclosure, after forming the organic encapsulation layer 30, the method of manufacturing the encapsulation layer may further include: forming a second inorganic material layer 72, wherein the second inorganic material layer 72 integrally covers the organic encapsulation layer 30.

According to an embodiment provided by the disclosure, before forming the first inorganic material layer 71 on the substrate, the method may further include: forming a light emitting layer 50 of an OLED on the second region 42.

The method of manufacturing the encapsulation layer provided by the embodiments of the disclosure will be described below in details in combination with the specific examples.

As shown in FIGS. 1a-1d and FIG. 3 which is a flow chart of a method of manufacturing an encapsulation layer provided by an embodiment of the disclosure, the method may include steps S301-S304.

In the step S301, the first protruding structure 61 (e.g., "dam" structure) is formed on the substrate 10, where the substrate 10 has the first region 41 and the second region 42 connected with each other, and the first protruding structure 61 is located at the joint of the first region 41 and the second region 42.

In the step S302, the strippable layer 20 is formed on the first region 41.

According to an embodiment provided by the disclosure, the strippable layer 20 is strippable from the substrate 10 under certain conditions, that is to say, the strippable layer 20 will not adversely affect other structures on substrate 10 after stripped.

In the step S303, the organic material layer 31 is formed on the second region 42 and at least a part of the first region 41, and at least a part of the edge portion of the organic material layer 31 covers the strippable layer 20. The light emitting layer 50 of the OLED is arranged on the second region 42.

That is to say, the central portion of the organic material layer 31 distal to the edge of the substrate 10 is located on the second region 42, while the edge portion of the organic material layer 31 proximal to the edge of the substrate 10 is located on the strippable layer 20 on the first region 41. Due to the viscosity, surface tension or the like of the organic material, the edge portion of the organic material layer 31 may has defects, e.g., slope climbing, uneven layer thickness, poor linearity and the like, in the actual production.

In the step S304, the strippable layer 20 is stripped from the substrate 10 to remove the portion of the organic material layer 31 covering the strippable layer 20 and form the organic encapsulation layer 30.

According to the embodiments provided by the disclosure, when the strippable layer 20 is stripped from the substrate 10, the strippable layer 20 may exert an external force on the edge of the organic material layer 31, so that the edge portion of the organic material layer 31 located on the strippable layer 20 is separated from the other portion of the organic material layer 31, that is, the edge portion of the organic material layer 31 covering the strippable layer 20 is removed, thereby forming the organic encapsulation layer 30 without the edge defect. In an implementation, the actual edge of the organic encapsulation layer 30 after the stripping may be aligned with the edge of the strippable layer 20 before the stripping, so that the linearity of the edge of the organic encapsulation layer 30 may be good.

In the method of manufacturing the encapsulation layer provided by the embodiments of the disclosure, the edge portion with defect of the organic material layer 31 can be removed by stripping the strippable layer 20, to form the organic encapsulation layer 30 without the edge defect, thereby improving the edge characteristics of the organic film layer, improving the edge encapsulation effect of the device, and thus promoting the realization of the narrow border of the device.

Furthermore, the first protruding structure 61 is a convex structure arranged on the substrate 10 for separating the first region 41 from the second region 42, so the first protruding structure 61 can align the inner edge of the strippable layer 20 with the edge of the second region 42 as possible, so that the edge of the organic encapsulation layer 30 can be closer to the edge of the display region (second region 42) and more regular when the strippable layer 20 is stripped.

As shown in FIGS. 1a-1d and FIG. 4 which is a flow chart of a method of manufacturing an encapsulation layer provided by an embodiment of the disclosure, the method may include steps S401-S404.

In the step S401, the first protruding structure 61 is formed on the substrate 10, where the substrate 10 has the first region 41 and the second region 42 connected with each other, and the first protruding structure 61 is located at the joint of the first region 41 and the second region 42.

According to an embodiment provided by the disclosure, the inner edge of the first region 41 is adjoined to the outer edge of the second region 42, so that the first protruding structure 61 can separate the first region 41 from the second region 42, i.e., the first protruding structure 61 may be used to define the second region 42.

According to an embodiment provided by the disclosure, the second protruding structure 62 which is protruding is arranged at the outer edge of the first region 41 distal to the second region 42. That is to say, the first protruding structure 61 and the second protruding structure 62 may define the first region 41.

According to an embodiment provided by the disclosure, the first protruding structure 61 and the second protruding structure 62 may be formed by way of coating or inkjet printing.

In the step S402, the strippable layer 20 is formed on the first region 41.

According to an embodiment provided by the disclosure, the strippable layer 20 is strippable from the substrate 10 under certain conditions, that is to say, the strippable layer 20 will not adversely affect other structures on substrate 10 after stripped.

According to an embodiment provided by the disclosure, the surface of the strippable layer 20 at the side proximal to the substrate 10 contacts with the underlying structure, and the surface roughness of the strippable layer 20 is greater than the surface roughness of the underlying structure. That is to say, the strippable layer 20 may be directly formed on the underlying structure, and the surface roughness of the strippable layer 20 is greater than the surface roughness of the underlying structure.

For example, when the strippable layer 20 is directly formed on the substrate 10, the strippable layer 20 at least partly contacts with the substrate 10, and the surface roughness of the strippable layer 20 is greater than the surface roughness of the substrate 10.

According to an embodiment provided by the disclosure, before the strippable layer 20 is formed on the first region 41 in the step S402, the method may further include: forming the first inorganic material layer 71 on the substrate, where the first inorganic material layer 71 integrally covers the substrate 10, that is, the first inorganic material layer 71 completely covers the first region 41 and the second region 42. At this time, when the strippable layer 20 is directly formed on the first inorganic material layer 71, the strippable layer 20 at least partly contacts with the first inorganic material layer 71, and the surface roughness of the strippable layer 20 is greater than the surface roughness of the first inorganic material layer 71.

According to an embodiment provided by the disclosure, the underlying structure may be any other layer structure, which is not limited in this embodiment.

Since the surface roughness of the strippable layer 20 is greater than the surface roughness of the underlying structure where the strippable layer 20 is located, the speed at which the liquid material extends on the surface of the strippable layer 20 is slower than the speed at which the liquid material extends on the surface of the underlying structure where the strippable layer 20 is located, so that the extending distance of the liquid material on the surface of the strippable layer 20 per unit time is smaller; that is, the overflow portion of the organic material layer 31 formed from the liquid material is smaller in the subsequent steps, so that the smaller non-display region (first region 41) may be reserved to promote the realization of the narrow border of the display device.

In the step S403, the organic material layer 31 is formed on the second region 42 and at least a part of the first region 41, and at least a part of the edge of the organic material layer 31 covers the strippable layer 20. The light emitting layer 50 of the OLED is arranged on the second region 42.

That is to say, the central portion of the organic material layer 31 distal to the edge of the substrate 10 is located on the second region 42, while the edge portion of the organic material layer 31 proximal to the edge of the substrate 10 is located on the strippable layer 20 on the first region 41.

According to an embodiment provided by the disclosure, the organic material layer 31 may be formed by curing the liquid material. That is, the liquid organic material is coated first and then the liquid organic material is cured to form the organic material layer 31.

According to an embodiment provided by the disclosure, the forming the organic material layer 31 by curing the liquid material may specifically include steps S4031-S4032.

In the step S4031, the liquid organic material (such as epoxy resin, acrylic ester or any other ink material) is coated on the second region 42 and at least a part of the first region 41 of the substrate 10 by the ink-jet printing process.

According to an embodiment provided by the disclosure, not only the ink-jet printing process has the advantages of simple process, fast deposition, good homogeneity and the like; but also the environment required by the ink-jet printing process is relatively easy to meet, so other structures on the substrate 10 will not be adversely affected in the process of forming the organic material layer 31.

In the step S4032, the liquid organic material is cured to form the organic material layer 31.

The levelling property, edge linearity, film thickness uniformity and the like of the organic material layer 31 have an important influence on the encapsulation effect of the light emitting layer 50 of the OLED in the display substrate. But in the process of forming the organic material layer 31, the factors such as viscosity and surface tension of the liquid organic material may lead to the defects in the edge portion of the formed solid organic material layer 31, e.g., slope climbing, uneven layer thickness, poor linearity and the like.

In the step S404, the strippable layer 20 is stripped from the substrate 10 to remove the portion of the organic material layer 31 covering the strippable layer 20 and form the organic encapsulation layer 30.

According to an embodiment provided by the disclosure, stripping the strippable layer 20 from the substrate 10 may include: illuminating (e.g., UV-illuminating) or heating the strippable layer 20 to reduce the binding force between the strippable layer 20 and substrate 10, and then stripping the strippable layer 20 from the substrate 10.

That is to say, the properties of the material forming the strippable layer 20 may change under certain conditions, such as illumination or heating, so that the binding force between the material and the underlying structure changes under the illumination or heating. Thus, when the strippable layer 20 located on the underlying structure needs to be stripped from the underlying structure, it is only required to illuminate or heat the strippable layer 20 in order to separate the strippable layer 20 from the underlying structure. According to an embodiment provided by the disclosure, the strippable layer 20 may be a kind of photoresist, such as UV (Ultraviolet Rays) glue.

According to the embodiments provided by the disclosure, when the strippable layer 20 is stripped from the substrate 10, the strippable layer 20 may exert an external force on the edge of the organic material layer 31, so that the edge portion of the organic material layer 31 located on the strippable layer 20 is separated from the other portion of the organic material layer 31, that is, the edge portion of the organic material layer 31 covering the strippable layer 20 is removed, thereby forming the organic encapsulation layer 30 without the edge defect. In an implementation, the actual edge of the organic encapsulation layer 30 after the stripping may be aligned with the edge of the strippable layer 20 before the stripping, so that the linearity of the edge of the organic encapsulation layer 30 may be good.

In the method of manufacturing the encapsulation layer provided by the embodiments of the disclosure, the edge portion with defect of the organic material layer 31 can be removed by stripping the strippable layer 20, to form the organic encapsulation layer 30 without the edge defect, thereby improving the edge characteristics of the organic film layer, improving the edge encapsulation effect of the device, and thus promoting the realization of the narrow border of the device.

Furthermore, the first protruding structure 61 is a convex structure arranged on the substrate 10 for separating the first region 41 from the second region 42, so the first protruding structure 61 can align the inner edge of the strippable layer 20 with the edge of the second region 42 as possible, so that the edge of the organic encapsulation layer 30 can be closer to the edge of the display region and more regular when the strippable layer 20 is stripped.

The second protruding structure 62 is a convex structure arranged on the substrate 10 for defining the first region 41 together with the first protruding structure 61, so the first protruding structure 61 and the second protruding structure 62 can not only ensure the accurate position of the formed strippable layer 20 (that is, the strippable layer 20 is limited between the first protruding structure 61 and the second protruding structure 62), but also the second protruding structure 62 can avoid the liquid organic material overflowing from the outer edge of the first region 41 in the process of forming the organic material layer 31.

Before the strippable layer 20 is illuminated or heated, the strippable layer 20 fits onto the substrate 10 closely. Thus, when the organic material layer 31 is formed, the strippable layer 20 will not affect the formation of the organic material layer 31; and after the strippable layer 20 is illuminated or heated, the viscidity of the strippable layer 20 is lowered so that the strippable layer 20 can be stripped from the substrate 10 easily, which will not affect the organic encapsulation layer 30 covering the display region, thereby ensuring the performance of the organic encapsulation layer 30 of the display region.

Figure 5:
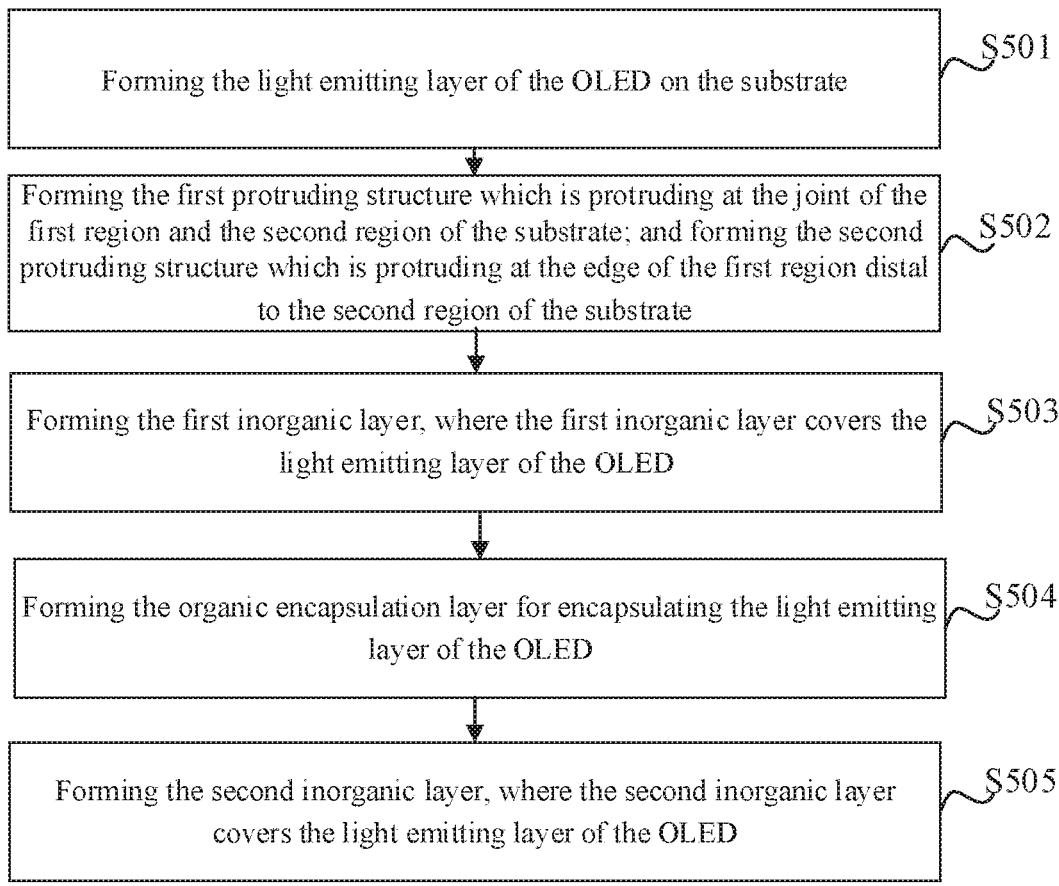
FIG. 5 is a flow chart of a method of manufacturing a display substrate provided by an embodiment of the disclosure.

According to an embodiment provided by the disclosure, FIG. 5 is a flow chart of a method of forming a display substrate provided by an embodiment of the disclosure, and as shown in FIGS. 1a-1d and FIG. 5, the method of manufacturing the display substrate may include steps S501-S505.

In the step S501, as shown in FIG. 1a, the light emitting layer 50 of the OLED is formed on the substrate 10.

The light emitting layer 50 of the OLED is mainly used to emit light, and is one of the important structures in the display substrate.

In the step S502, as shown in FIG. 1a, the first protruding structure 61 which is protruding is formed at the joint of the first region 41 and the second region 42 of the substrate 10; and the second protruding structure 62 which is protruding is formed at the edge of the first region 41 distal to the second region 42 of the substrate 10.

According to an embodiment provided by the disclosure, the first protruding structure 61 and the second protruding structure 62 may be formed by way of coating or inkjet printing.

In the step S503, as shown in FIG. 1a, the first inorganic layer 71 is formed, and the first inorganic layer 71 covers the light emitting layer 50 of the OLED.

According to an embodiment provided by the disclosure, the first inorganic layer 71 may cover the exposed substrate 10, the first protruding structure 61, the second protruding structure 62 and the light emitting layer 50 of the OLED, and the first inorganic layer 71 may be used as a part of the encapsulation structure of the light emitting layer 50 of the OLED.

In the step S504, the organic encapsulation layer 30 for encapsulating the light emitting layer 50 of the OLED is formed.

The specific method of manufacturing the organic encapsulation layer 30 may refer to the method of manufacturing the encapsulation layer provided by the embodiments of the disclosure, and the repeated description thereof will be omitted here.

Figure 1D:
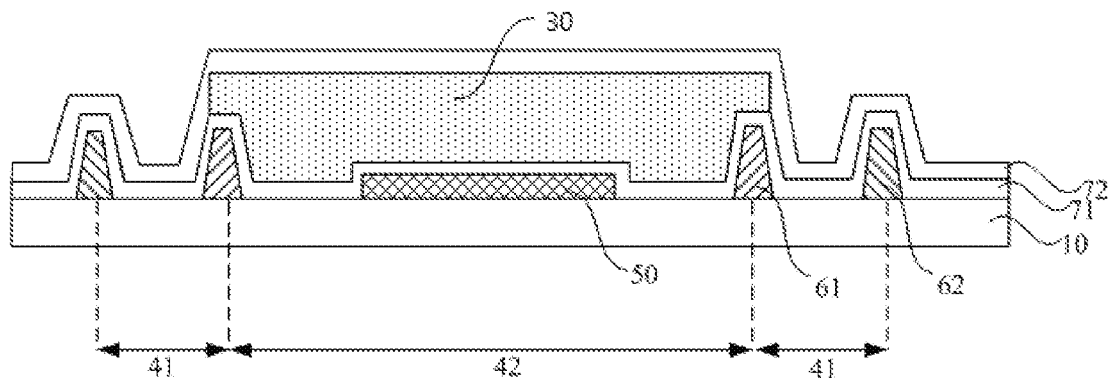
Figure 2:
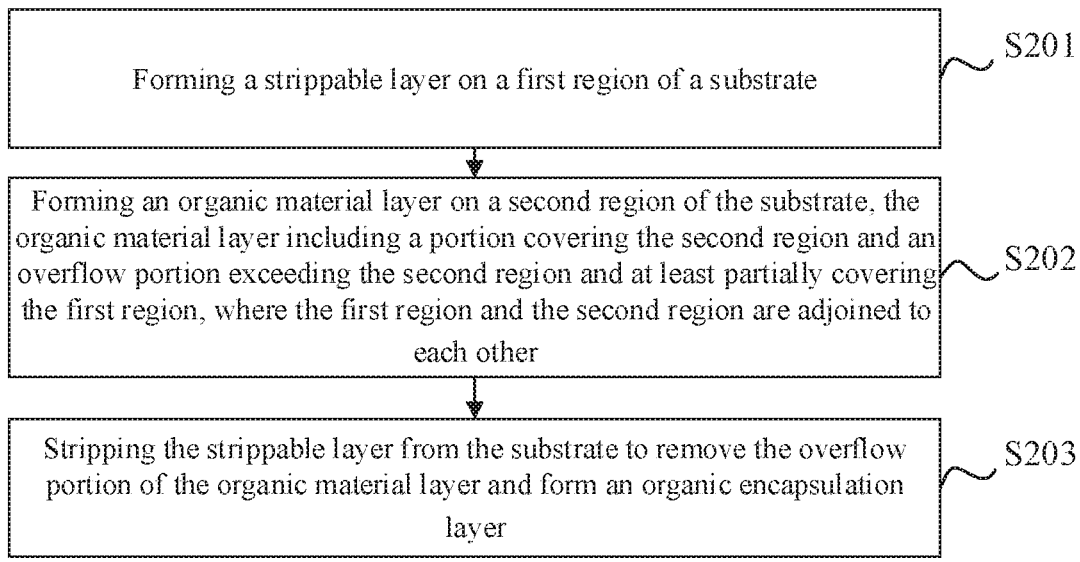
FIG. 2 is a flow chart of a method of manufacturing an encapsulation layer provided by an embodiment of the disclosure.
Figure 3:
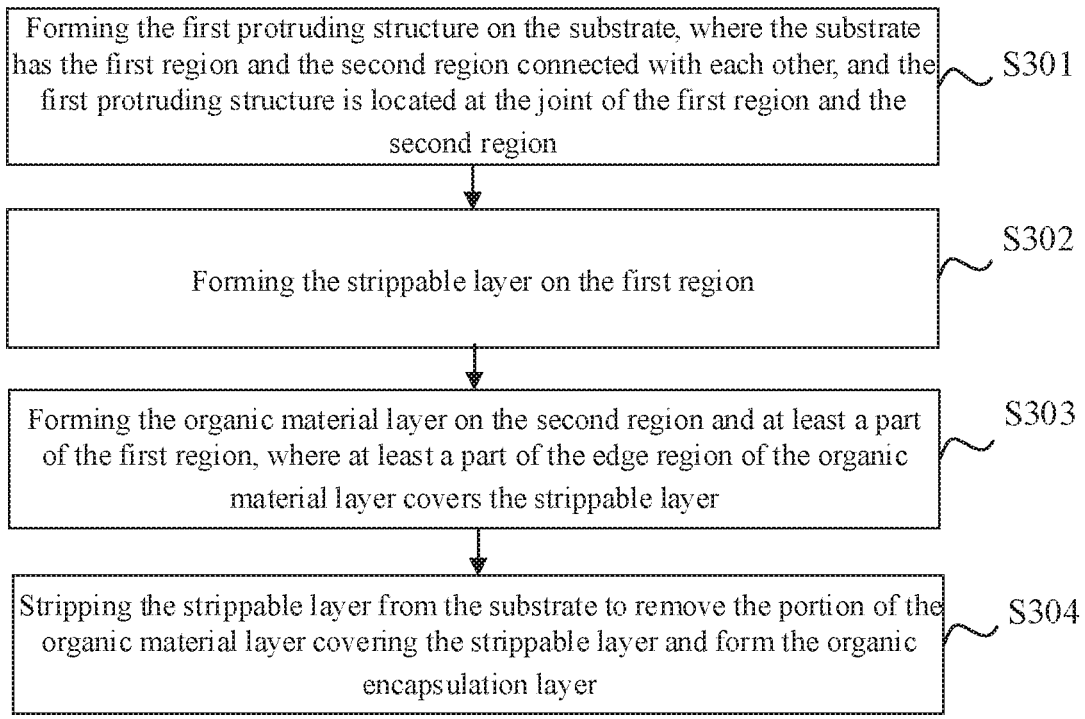
FIG. 3 is a flow chart of a method of manufacturing an encapsulation layer provided by an embodiment of the disclosure.
Figure 4:
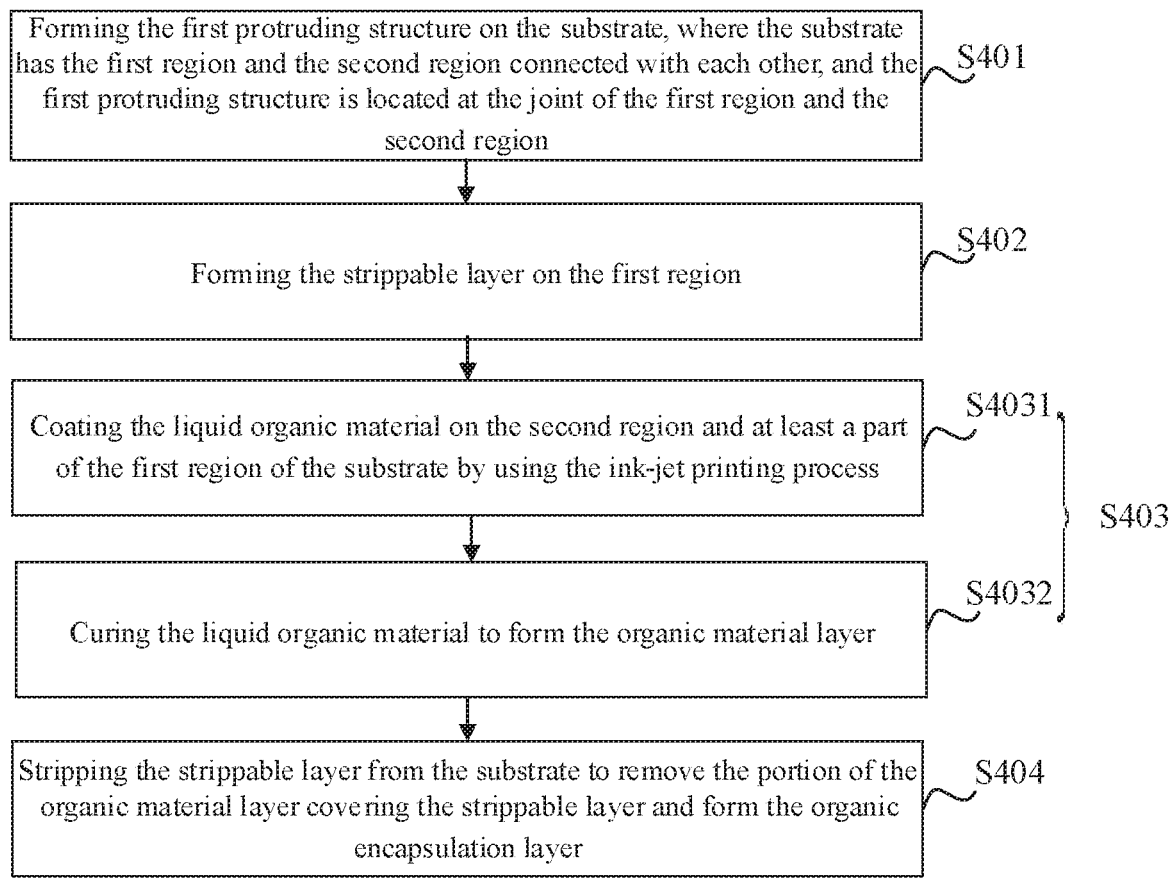
FIG. 4 is a flow chart of a method of manufacturing an encapsulation layer provided by an embodiment of the disclosure.

In the step S505, as shown in FIG. 1d, the second inorganic layer 72 is formed, and the second inorganic layer 72 covers the light emitting layer 50 of the OLED.

According to an embodiment provided by the disclosure, the second inorganic layer 72 may cover the organic encapsulation layer 30 but not cover the first inorganic layer 71.

According to an embodiment provided by the disclosure, the layer structures covering the light emitting layer 50 of the OLED include the first inorganic layer 71, the organic encapsulation layer 30 and the second inorganic layer 72 in sequence from bottom to top, and the first inorganic layer 71, the organic encapsulation layer 30 and the second inorganic layer 72 constitute the encapsulation structure for encapsulating the light emitting layer 50 of the OLED.

In the method of forming the display substrate provided by the embodiments of the disclosure, the edge portion with defect of the organic material layer 31 can be removed by stripping the strippable layer 20, to form the organic encapsulation layer 30 without the edge defect, thereby improving the edge characteristics of the organic film layer, improving the edge encapsulation effect of the device, and thus promoting the realization of the narrow border of the device.

An embodiment of the disclosure further provides a display substrate, as shown in FIG. 1d, which may include: a substrate, which includes a first region 41 and a second region 42 which are adjoined to each other, and a light emitting layer 50 of an OLED is arranged on the second region 42; and an organic encapsulation layer 30 formed on the light emitting layer 50 by using the method of manufacturing the encapsulation layer provided by the embodiments of the disclosure.

According to an embodiment provided by the disclosure, as shown in FIG. 1d, the substrate may include: a substrate 10 having the first region 41 and the second region 42 connected with the first region 41; and a first protruding structure 61 located at the joint of the first region 41 and the second region 42 of the substrate 10.

According to an embodiment provided by the disclosure, the light emitting layer of the OLED arranged on the second region 42 may include the light emitting layer 50 of the OLED located between the organic encapsulation layer 30 and the substrate 10. According to an embodiment provided by the disclosure, the organic encapsulation layer 30 covers the second region 42, and at least a part of the edge of the organic encapsulation layer 30 is aligned with the boundary of the first region 41 and the second region 42.

In the method of forming the display substrate provided by the embodiments of the disclosure, the encapsulation structure of the display substrate is formed by using the method of manufacturing the encapsulation layer provided by the embodiments of the disclosure, so the edge of the encapsulation layer 30 in the encapsulation structure has no defect, thereby ensuring the display performance of the display substrate.

An embodiment of the invention further provides a display device which includes the display substrate described above.

According to an embodiment provided by the disclosure, the display device may be any other product or component with display functions such as an OLED display panel, an e-paper, a mobile phone, a tablet, a television, a display, a laptop, a digital photo frame, a navigator.

It should be noted that the relational terms such as first and second herein are only used to distinguish one entity or operation from another and do not necessarily require or imply any such actual relationship or sequence between these entities or operations. And the term "include", "contain" or any other variant is intended to encompass the non-exclusive inclusion, so that the process, method, object or equipment including a series of elements not only includes those elements, but also includes other elements which are not listed clearly or includes the elements inherent in such process, method, object or equipment. Without more restrictions, the element defined by the sentence "include a . . . " does not preclude the existence of another identical element in the process, method, object or equipment including the element.

In accordance with the embodiments of the disclosure, as described above, these embodiments do not describe all the details exhaustively and do not limit the disclosure to the specific embodiments described. Obviously, many modifications and changes may be made according to the above description. This specification selects and specifically describes these embodiments in order to better explain the principle and practical application of the disclosure, so that those skilled in the art can make good use of the disclosure and the modifications and usages on the basis of the disclosure. The disclosure is only limited by the claims and their full scope and equivalents.

What is claimed is:

1. A method of manufacturing an encapsulation layer, comprising:
   preparing a substrate having a first region and a second region which are adjoined to each other;
   forming a light emitting layer of an organic light emitting diode on the second region of the substrate;
   forming a first inorganic material layer on the light emitting layer on the second region and the first region such that the first inorganic material layer completely covers the first region and the second region;
   forming a strippable layer on a part of the first inorganic material layer on the first region such that a surface of the strippable layer proximal to the substrate is in contact with the part of the first inorganic material layer on the first region;
   then forming an organic material layer such that the organic material layer comprises a portion covering the second region and an overflow portion exceeding the second region and at least partially covering the first region; and
   stripping the strippable layer from the part of the first inorganic material layer on the first region to remove the overflow portion of the organic material layer such that the portion of the organic material layer covering the second region is used as an organic encapsulation layer for encapsulating the light emitting layer of the organic light emitting diode on the second region.

2. The method according to claim 1, wherein forming a strippable layer on a part of the first inorganic material layer on the first region comprises:
   coating photoresist on the first region of the substrate to form the strippable layer.

3. The method according to claim 2, wherein stripping the strippable layer from the part of the first inorganic material layer on the first region comprises:
   illuminating or heating the photoresist so as to lower viscidity of the photoresist; and
   stripping the photoresist manually or mechanically.

4. The method according to claim 2, wherein after coating photoresist on the first region of the substrate to form the strippable layer, the method further comprises:
   etching the photoresist so that surface roughness of the strippable layer is greater than surface roughness of the first inorganic material layer.

5. The method according to claim 1, wherein forming the organic material layer comprises:
   coating a liquid organic material on the substrate by an ink-jet printing process, wherein the liquid organic material at least covers the whole second region and a part of the first region proximal to the second region; and
   curing the liquid organic material to form the organic material layer.

6. The method according to claim 5, wherein the liquid organic material comprises an ink material.

7. The method according to claim 1, wherein after forming the organic encapsulation layer, the method further comprises: forming a second inorganic material layer, wherein the second inorganic material layer completely covers the organic encapsulation layer.

8. The method according to claim 1, further comprising forming a first protruding structure at an adjoining position of the first region and the second region of the substrate.

9. The method according to claim 8, further comprising forming a second protruding structure on the first region of the substrate, and the second protruding structure being at a side of the first protruding structure distal to the second region.

10. A method of manufacturing an encapsulation layer, comprising:
    forming a first protruding structure as a dam on a substrate to define a second region;
    forming a second protruding structure on the substrate such that the second protruding structure is provided at a side of the first protruding structure distal to the second region, the first protruding structure and the second protruding structure together define a first region, and the first region and the second region are adjoined to each other;
    forming a first inorganic material layer on the first region and the second region of the substrate such that the first inorganic material layer completely covers the substrate;
    forming a strippable layer on a part of the first inorganic material layer on the first region of the substrate defined by the first protruding structure and the second protruding structure such that a surface of the strippable layer proximal to the substrate is in contact with the first inorganic material layer;
    forming an organic material layer such that the organic material layer comprises a portion covering the second region and an overflow portion exceeding the second region and at least partially covering the first region; and
    stripping the strippable layer from the part of the first inorganic material layer on the first region to remove the overflow portion of the organic material layer such that the portion of the organic material layer covering the second region is used as an organic encapsulation layer.

11. The method according to claim 10, wherein forming a strippable layer on a part of the first inorganic material layer on the first region of the substrate comprises:
    coating photoresist on the first region of the substrate to form the strippable layer.

12. The method according to claim 11, wherein stripping the strippable layer from the part of the first inorganic material layer on the first region comprises:
    illuminating or heating the photoresist so as to lower viscidity of the photoresist; and
    stripping the photoresist manually or mechanically.

13. The method according to claim 11, wherein after coating photoresist on the first region of the substrate to form the strippable layer, the method further comprises:

etching the photoresist so that surface roughness of the strippable layer is greater than surface roughness of the first inorganic material layer.

14. The method according to claim 10, wherein forming an organic material layer comprises:
coating a liquid organic material on the substrate by an ink-jet printing process, wherein the liquid organic material at least covers the whole second region and a part of the first region proximal to the second region; and
curing the liquid organic material to form the organic material layer.

15. The method according to claim 14, wherein the liquid organic material comprises an ink material.

16. The method according to claim 10, wherein after forming the organic encapsulation layer, the method further comprises: forming a second inorganic material layer, wherein the second inorganic material layer completely covers the organic encapsulation layer.

* * * * *